United States Patent
Xu et al.

(10) Patent No.: US 9,013,648 B1
(45) Date of Patent: Apr. 21, 2015

(54) ANTISTATIC STRUCTURE OF ARRAY SUBSTRATE

(71) Applicant: Shenzhen China Star Optelectronics Technology Co., Ltd., Shenzhen, Guangdong (CN)

(72) Inventors: Xiangyang Xu, Guangdong (CN); Weimin Chang, Guangdong (CN); Zhiyang Song, Guangdong (CN); Liang Wang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/345,731

(22) PCT Filed: Oct. 18, 2013

(86) PCT No.: PCT/CN2013/085518
§ 371 (c)(1),
(2) Date: Mar. 19, 2014

(51) Int. Cl.
*G02F 1/1362* (2006.01)
*G02F 1/1368* (2006.01)
*H01L 27/12* (2006.01)
*H01L 27/02* (2006.01)

(52) U.S. Cl.
CPC ........ *G02F 1/136204* (2013.01); *G02F 1/1368* (2013.01); *H01L 27/124* (2013.01); *H01L 27/0288* (2013.01)

(58) Field of Classification Search
CPC ................ H01L 2924/00; H01L 2224/48465; H01L 2224/48247; H01L 2224/48227; H01L 2924/00014
See application file for complete search history.

(56) References Cited

U.S. PATENT DOCUMENTS

2012/0169976 A1    7/2012    Kim et al.

FOREIGN PATENT DOCUMENTS

| CN | 103091922 A | 5/2013 |
| CN | 103163668 A | 6/2013 |

*Primary Examiner* — Tony Tran
(74) *Attorney, Agent, or Firm* — Andrew C. Cheng

(57) ABSTRACT

The present invention provides an antistatic structure of an array substrate, which includes: an effective zone (60) of an array substrate and a plurality of dummy wires (26) surrounding the effective zone (60). The effective zone (60) includes a plurality of signal wires (22) and a plurality of shorting bars (24) respectively in electrical connection with the plurality of signal wires (22). The dummy wires (26) are set to be respectively corresponding to and adjacent to outermost ones of the shorting bars (24) of the effective zone (60). The dummy wires (26) each include an inner side (28) that is close to the shorting bars (24) and forms a saw-toothed arrangement. The present invention arranges a dummy wire adjacent to each of the outermost ones of shorting bars and the dummy wire has one side that is close to the shorting bar and forms a saw-toothed arrangement. As such, during a manufacturing process of the array substrate, particularly in dry etching operations of an insulation protection layer and an active layer, metal intersections of the shorting bar can be well protected from static electricity damage caused by abnormal discharge resulting from plasma so as to improve product quality.

5 Claims, 4 Drawing Sheets

ANTISTATIC STRUCTURE OF ARRAY SUBSTRATE

BACKGROUND OF THE INVENTION

1. Field of the Invention

The present invention relates to the field of displaying technology, and in particular to an antistatic structure of an array substrate.

2. The Related Arts

Liquid crystal displays (LCDs) have a variety of advantages, such as thin device body, low power consumption, and being free of radiation, and are thus widely used. Most of the liquid crystal displays that are currently available in the market are backlighting liquid crystal displays, which comprise a casing, a liquid crystal display panel received in the casing, and a backlight module arranged in the casing to be opposite to the liquid crystal display panel. The operation principle of the liquid crystal display panel is that liquid crystal molecules interposed between two parallel glass substrates and a drive voltage is applied to the two glass substrates to control the rotation of the liquid crystal molecules in order to refract out light emitting from the backlight module to generate images.

ESD (Electro-Static Discharge) has long been an unsolved problem of the semiconductor industry. ESD may lead to reduction of yield rate, increase of cost, and lowering of throughput. In the manufacture of liquid crystal displays, particularly the manufacture of liquid crystal display panels, ESD has also long affected the quality of the liquid crystal displays.

ESD is generally generated by three causes:

The first cause is particles. Any particle may cause damage to a device and even results in discarding. Thus, in the manufacture operations of semiconductors, control of particles is an important job.

The second is engineering condition and raw material. In the manufacture of the liquid crystal display panels, various operations may have conditions that generate static electricity, including deposition process, photo process, etching process, stripping process, and cleaning process. Further, the raw materials used in these processes may also induce static electricity due to material defects.

The third is concerning design factors. The quality of design may directly affect the condition associated with static electricity.

To improve the quality of a product and to reduce the cost of manufacture, ESD protection is commonly employed in the manufacture operations of the liquid crystal display panels. The EDS protection is generally of two types. The first one is internal component protection of a liquid crystal display panel, which generally comprises an ESD ring arranged at starting and terminating ends of conductive lines (such as gate lines and data lines) of the liquid crystal display panel. The second type is protection applied to peripheral circuits of a liquid crystal display panel, which is used to protect the panel peripheral circuits from damages caused by static electricity in an array manufacturing process and a rear stage process. In a conventional structure of a TFT (Thin-Film Transistor) array substrate, the sequence of layers of films is: first metal layer (Gate/Com), gate insulation layer (GI), active layer, second metal layer (S/D), passivation layer (PVX), and transparent conductive layer (Indium Tin Oxide, ITO). To control the cost of a product, an illuminating operation is carried out to grade a product after a cutting operation of in the manufacturing process of a cell stage is finished so that a qualified liquid crystal display panel can be used in a module. To enable the illuminating operation to be carried out in the manufacturing process of the cell stage while not to affect a normal illuminating operation to be carried out in a module stage, as shown in FIG. 1, it is a common practice to arrange shorting bars 100 on some circuits of the peripheral patterning of the liquid crystal display panel during the manufacturing process of the array substrate in order to reduce the ESD phenomenon. After grading the liquid crystal display panel has been completed through illuminating in the manufacturing process of the cell stage, laser is applied to cut off the connections of the shorting bars 100 with the data lines and the gate lines. However, in such technology, damages resulting from ESD may still occur at metal intersections of the shorting bars 100 due to abnormal discharge caused by plasma in dry etching operations of the insulation protection layer and the active layer and the quality of a product may thus be affected.

SUMMARY OF THE INVENTION

An object of the present invention is to provide an antistatic structure of an array structure, which, during a manufacture process of an array substrate, particularly in dry etching operations of an insulation protection layer and an active layer, can well protect metal intersections of shorting bars from electrostatic damages caused by abnormal discharges resulting from plasma and thus, improves product quality, increases manufacture efficiency, and lower down manufacture cost.

To achieve the above object, the present invention provides an antistatic structure of an array substrate, which comprises: an effective zone of an array substrate and a plurality of dummy wires surrounding the effective zone. The effective zone of the array substrate comprises a plurality of signal wires and a plurality of shorting bars respectively in electrical connection with the plurality of signal wires. The dummy wires are set to be respectively corresponding and adjacent to outermost ones of the shorting bars of the effective zone. The dummy wires each comprise an inner side that is close to the shorting bars and forms a saw-toothed arrangement.

The plurality of signal wires, the plurality of shorting bars, and the plurality of dummy wires are formed on a common substrate.

The dummy wires are of a number of four and the four dummy wires are arranged in a rectangular frame configuration to circumferentially enclose the effective zone of the array substrate. Each of the dummy wires is parallel to an adjacent one of the outermost shorting bars.

The dummy wires each comprise: a first metal layer formed on the substrate, a gate insulation layer covering the first metal layer and the substrate, an active layer formed on the gate insulation layer and corresponding to the first metal layer, a second metal layer formed on the active layer, and a passivation layer covering the second metal layer and the gate insulation layer.

The shorting bars each comprise: a first metal layer formed on the substrate, a gate insulation layer covering the first metal layer and the substrate, a passivation layer formed on the gate insulation layer, and a first hole extending through the gate insulation layer and the passivation layer. The first hole is arranged to correspond to the first metal layer so as to expose the first metal layer.

A transparent conductive layer is formed on the exposed first metal layer, an inside surface of the first hole, and a portion of the passivation layer surrounding the first hole so that through the transparent conductive layer, the shorting bar is electrically connected to the signal wire.

The signal wires each comprise: a first metal layer formed on the substrate, a gate insulation layer covering the first metal layer and the substrate, a second metal layer formed on the gate insulation layer and corresponding to the first metal layer, and a passivation layer covering the second metal layer and the gate insulation layer. The passivation layer comprises a second hole formed therein at a location close to the shorting bar and corresponding to the first hole. The second hole extends through the passivation layer so as to expose the second metal layer.

A transparent conductive layer is formed on the exposed second metal layer, an inside surface of the second hole, and a portion of the passivation layer surrounding the second hole so that through the transparent conductive layer, the shorting bar is electrically connected to the signal wire.

The gate insulation layer is made of silicon and the substrate is a glass substrate.

The signal wires comprises data lines and gate lines.

The present invention also provides an antistatic structure of an array substrate, which comprises: an effective zone of an array substrate and a plurality of dummy wires surrounding the effective zone, the effective zone of the array substrate comprising a plurality of signal wires and a plurality of shorting bars respectively in electrical connection with the plurality of signal wires, the dummy wires being set to be respectively corresponding and adjacent to outermost ones of the shorting bars of the effective zone, the dummy wires each comprising an inner side that is close to the shorting bars and forms a saw-toothed arrangement;

wherein the plurality of signal wires, the plurality of shorting bars, and the plurality of dummy wires are formed on a common substrate;

wherein the dummy wires are of a number of four and the four dummy wires are arranged in a rectangular frame configuration to circumferentially enclose the effective zone of the array substrate, each of the dummy wires being parallel to an adjacent one of the outermost shorting bars;

wherein the dummy wires each comprise: a first metal layer formed on the substrate, a gate insulation layer covering the first metal layer and the substrate, an active layer formed on the gate insulation layer and corresponding to the first metal layer, a second metal layer formed on the active layer, and a passivation layer covering the second metal layer and the gate insulation layer;

wherein the shorting bars each comprise: a first metal layer formed on the substrate, a gate insulation layer covering the first metal layer and the substrate, a passivation layer formed on the gate insulation layer, and a first hole extending through the gate insulation layer and the passivation layer, the first hole being arranged to correspond to the first metal layer so as to expose the first metal layer; and wherein a transparent conductive layer is formed on the exposed first metal layer, an inside surface of the first hole, and a portion of the passivation layer surrounding the first hole so that through the transparent conductive layer, the shorting bar is electrically connected to the signal wire.

The signal wires each comprise: a first metal layer formed on the substrate, a gate insulation layer covering the first metal layer and the substrate, a second metal layer formed on the gate insulation layer and corresponding to the first metal layer, and a passivation layer covering the second metal layer and the gate insulation layer. The passivation layer comprises a second hole formed therein at a location close to the shorting bar and corresponding to the first hole. The second hole extends through the passivation layer so as to expose the second metal layer.

A transparent conductive layer is formed on the exposed second metal layer, an inside surface of the second hole, and a portion of the passivation layer surrounding the second hole so that through the transparent conductive layer, the shorting bar is electrically connected to the signal wire.

The gate insulation layer is made of silicon and the substrate is a glass substrate.

The signal wires comprises data lines and gate lines.

The efficacy of the present invention is that the present invention provides an antistatic structure of an array substrate, wherein a dummy wire is arranged adjacent to each of the outermost ones of shorting bars and the dummy wire has one side that is close to the shorting bar and forms a saw-toothed arrangement. As such, during a manufacturing process of the array substrate, particularly in dry etching operations of an insulation protection layer and an active layer, tip discharge is used to well protect metal intersections of the shorting bar from static electricity damage caused by abnormal discharge resulting from plasma so as to improve product quality, increase manufacture efficiency, and lower down manufacture cost.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

The present invention will be explained with reference to a VA (Vertical Alignment) display mode, but is not limited to the VA display mode.

Figure 1:
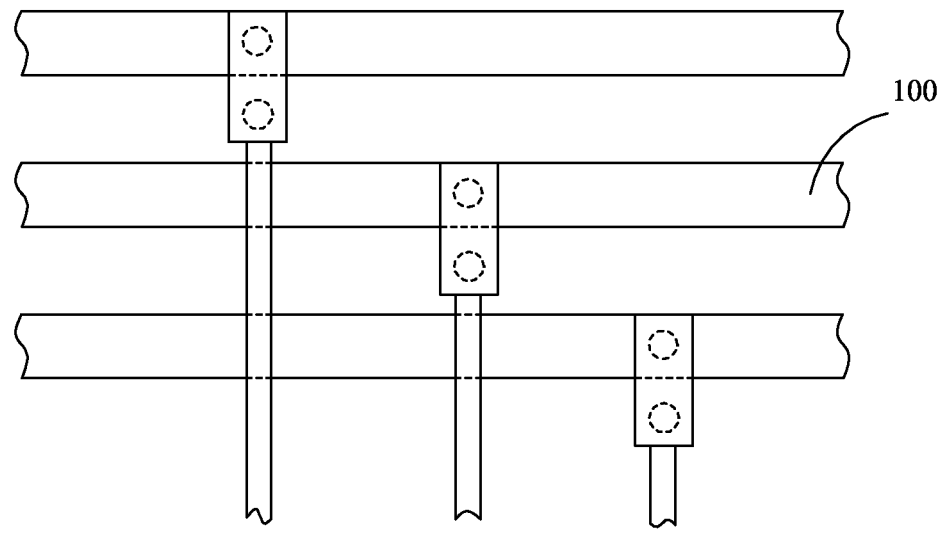
FIG. 1 is a schematic view showing a conventional antistatic structure of an array substrate.
Figure 2:
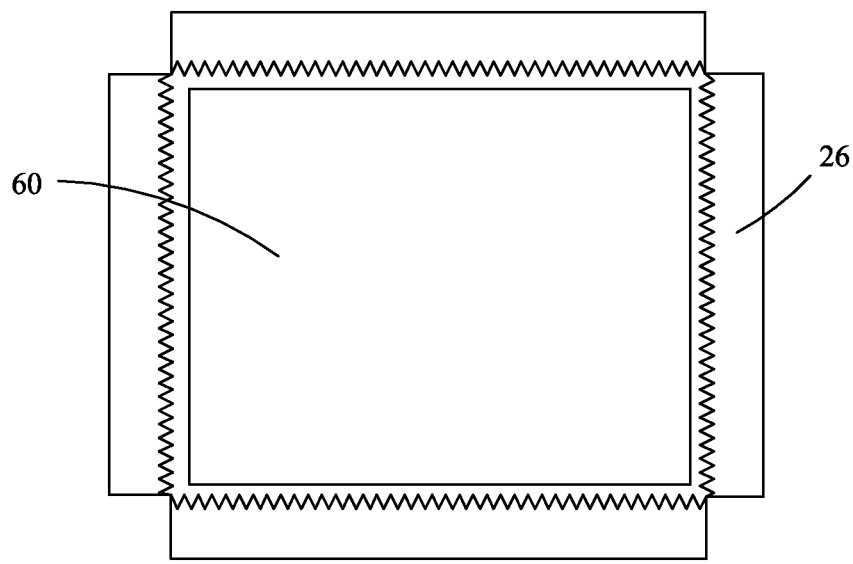
FIG. 2 is a schematic view showing a rectangular frame configuration of dummy wires according to the present invention.
Figure 3:
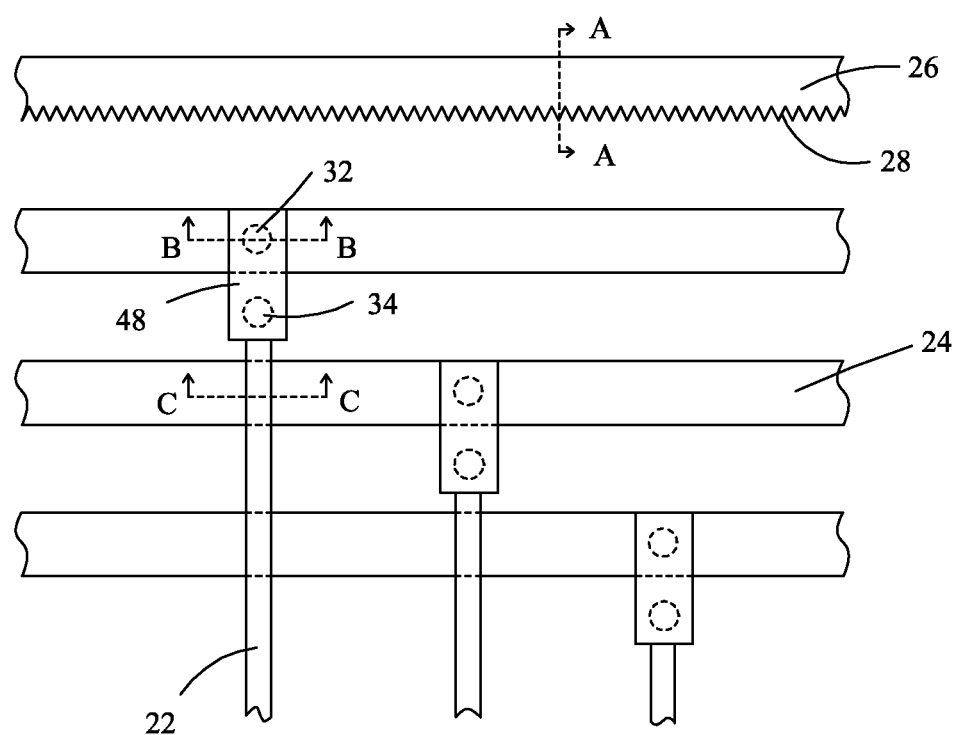
FIG. 3 is a schematic view showing an antistatic structure of an array substrate according to the present invention.

The present invention provides an arrangement that, in the manufacture of an array substrate, patternizes and forms dummy wires that are parallel to shorting bars at location adjacent to the shorting bars. In other words, the present invention provides an antistatic structure of an array substrate and, as shown in FIGS. 2 and 3, specifically comprises: an effective zone 60 of the array substrate and a plurality of dummy wires 26 surrounding the effective zone 60. The effective zone 60 of the array substrate comprises a plurality of signal wires 22 and a plurality of shorting bars 24 respectively in electrical connection with the plurality of signal wires 22. The dummy wires 26 are set to be respectively corresponding and adjacent to the outermost ones of the shorting bars 24 of the effective zone 60. The dummy wires 26 each comprise an inner side 28 that is close to the shorting bars 24 and forms a saw-toothed arrangement that enables the practice of tip discharge so that through raising the dummy wires 26 and forming the saw-toothed arrangement on the inner sides 28 thereof, tip discharge may be applied to protect the shorting bars 24 and avoid internal static electricity damage. In the instant embodiment, the signal wires 22 comprise data lines and gate lines.

Figure 4:
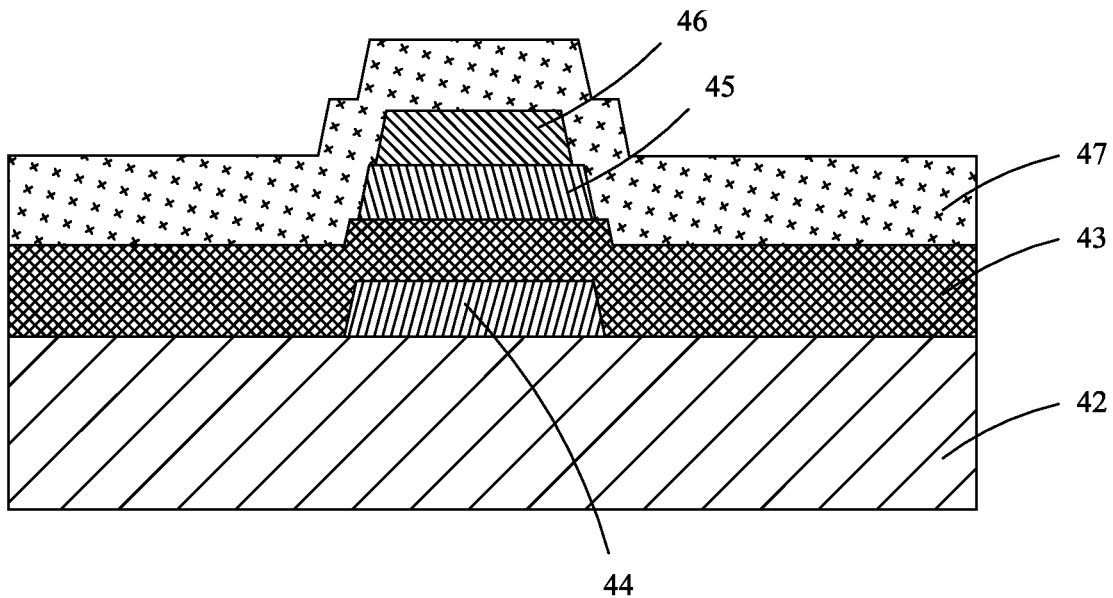
FIG. 4 is a cross-sectional view taken along line A-A of FIG. 3.
Figure 5:
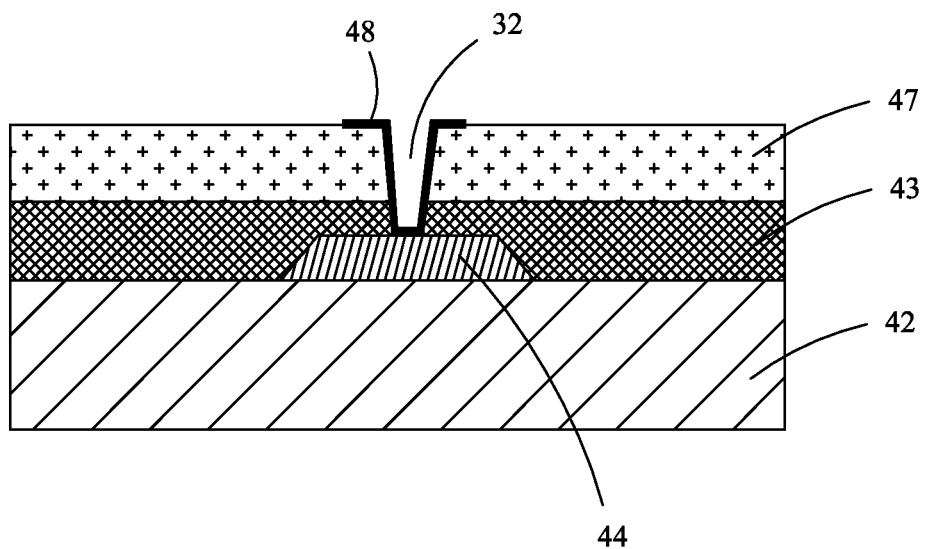
FIG. 5 is a cross-sectional view taken along line B-B of FIG. 3.
Figure 6:
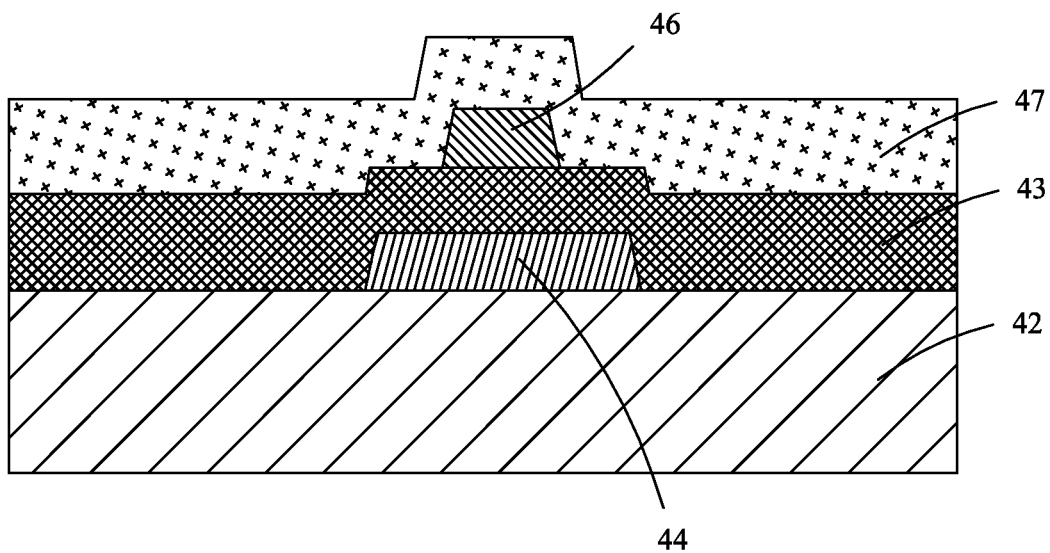
FIG. 6 is a cross-sectional view taken along line C-C of FIG. 3.

In the instant embodiment, the plurality of signal wires 22, the plurality of shorting bars 24, and the plurality of dummy wires 26 are formed on the same substrate 42上. Referring to FIG. 4, the dummy wires 26 each comprise: a first metal layer 44 formed on the substrate 42, a gate insulation layer 43 covering the first metal layer 44 and the substrate 42, an active layer (a semiconductive material layer) 45 formed on the gate insulation layer 43 and corresponding to the first metal layer 44, a second metal layer 46 formed on the active layer 45, and a passivation layer 47 covering the second metal layer 46 and the gate insulation layer 43. Referring to FIG. 5, the shorting bars 24 each comprise: a first metal layer 44 formed on the substrate 42, a gate insulation layer 43 covering the first metal layer 44 and the substrate 42, a passivation layer 47 formed on the gate insulation layer 43, and a first hole 32 extending through the gate insulation layer 43 and the passivation layer 47. The first hole 32 is arranged to correspond to the first metal layer 44 so as to expose the first metal layer 44. Referring to FIG. 6, the signal wires 22 each comprise: a first metal layer 44 formed on the substrate 42, a gate insulation layer 43 covering the first metal layer 44 and the substrate 42, a second metal layer 46 formed on the gate insulation layer 43 and corresponding to the first metal layer 44, and a passivation layer 47 covering the second metal layer 46 and the gate insulation layer 43. The passivation layer 47 comprises a second hole 34 (see FIG. 3) formed therein at a location close to the shorting bar 24 and corresponding to the first hole 32. The second hole 34 extends through the passivation layer 47 so as to expose the second metal layer 46. The gate insulation layer 43 is preferably made of silicon and the substrate 42 is preferably a glass substrate.

A transparent conductive layer 48 is formed on the exposed portion of the first metal layer 44, an inside surface of the first hole 32, and a portion of the passivation layer 47 surrounding the first hole 32. Similarly, the transparent conductive layer 48 is formed on the exposed portion of the second metal layer 46, an inside surface of the second hole 34, and a portion of the passivation layer 47 surrounding the second hole 34. Through the transparent conductive layer 48, electrical connection is formed between the shorting bar 24 and the signal wire 22, which in combination with tip discharge performed at the saw-toothed arrangement of the dummy wire 26, provides excellent protection of the metal intersection of the shorting bar 24 from static electricity damage caused by abnormal discharge resulting from plasma during dry etching operations of the insulation protection layer and the active layer.

In the instant embodiment, the transparent conductive layer 48 is made of indium tin oxide (ITO).

In the instant embodiment, the plurality of dummy wires 26 is arranged to circumferentially surround the effective zone 60. Preferably, the dummy wires 26 are of a number of four and the four dummy wires 26 are arranged in a rectangular frame configuration to circumferentially enclose the effective zone 60 of the array substrate. Each of the dummy wires 26 is parallel to an adjacent one of the outermost shorting bars 24, as shown in FIG. 2.

In summary, the present invention provides an antistatic structure of an array substrate, wherein a dummy wire is arranged adjacent to each of the outermost ones of shorting bars and the dummy wire has one side that is close to the shorting bar and forms a saw-toothed arrangement. As such, during a manufacturing process of the array substrate, particularly in dry etching operations of an insulation protection layer and an active layer, tip discharge is used to well protect metal intersections of the shorting bar from static electricity damage caused by abnormal discharge resulting from plasma so as to improve product quality, increase manufacture efficiency, and lower down manufacture cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An antistatic structure of an array substrate, comprising: an effective zone of an array substrate and a plurality of dummy wires surrounding the effective zone, the effective zone of the array substrate comprising a plurality of signal wires and a plurality of shorting bars respectively in electrical connection with the plurality of signal wires, the dummy wires being set to be respectively corresponding and adjacent to outermost ones of the shorting bars of the effective zone, the dummy wires each comprising an inner side that is close to the shorting bars and forms a saw-toothed arrangement;

wherein the plurality of signal wires, the plurality of shorting bars, and the plurality of dummy wires are formed on a common substrate;

wherein the dummy wires are of a number of four and the four dummy wires are arranged in a rectangular frame configuration to circumferentially enclose the effective zone of the array substrate, each of the dummy wires being parallel to an adjacent one of the outermost shorting bars;

wherein the dummy wires each comprise: a first metal layer formed on the substrate, a gate insulation layer covering the first metal layer and the substrate, an active layer formed on the gate insulation layer and corresponding to the first metal layer, a second metal layer formed on the active layer, and a passivation layer covering the second metal layer and the gate insulation layer;

wherein the shorting bars each comprise: a first metal layer formed on the substrate, a gate insulation layer covering the first metal layer and the substrate, a passivation layer formed on the gate insulation layer, and a first hole extending through the gate insulation layer and the passivation layer, the first hole being arranged to correspond to the first metal layer so as to expose the first metal layer; and wherein a transparent conductive layer is formed on the exposed first metal layer, an inside surface of the first hole, and a portion of the passivation layer surrounding the first hole so that through the transparent conductive layer, the shorting bar is electrically connected to the signal wire.

2. The antistatic structure of the array substrate as claimed in claim 1, wherein the signal wires each comprise: a first metal layer formed on the substrate, a gate insulation layer covering the first metal layer and the substrate, a second metal layer formed on the gate insulation layer and corresponding to the first metal layer, and a passivation layer covering the second metal layer and the gate insulation layer, the passivation layer comprising a second hole formed therein at a location close to the shorting bar and corresponding to the first hole, the second hole extending through the passivation layer so as to expose the second metal layer.

3. The antistatic structure of the array substrate as claimed in claim 2, wherein a transparent conductive layer is formed on the exposed second metal layer, an inside surface of the second hole, and a portion of the passivation layer surrounding the second hole so that through the transparent conductive layer, the shorting bar is electrically connected to the signal wire.

4. The antistatic structure of the array substrate as claimed in claim 2, wherein the gate insulation layer is made of silicon and the substrate is a glass substrate.

5. The antistatic structure of the array substrate as claimed in claim 1, wherein the signal wires comprises data lines and gate lines.

\* \* \* \* \*